(12) United States Patent
Ferstl

(10) Patent No.: US 11,533,803 B2
(45) Date of Patent: Dec. 20, 2022

(54) ARRANGEMENT FOR HEAT EXCHANGE

(71) Applicant: AUDI AG, Ingolstadt (DE)

(72) Inventor: Thomas Ferstl, Ingolstadt (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 17/516,457

(22) Filed: Nov. 1, 2021

(65) Prior Publication Data

US 2022/0141947 A1 May 5, 2022

(30) Foreign Application Priority Data

Nov. 2, 2020 (DE) .......................... 102020128729.1

(51) Int. Cl.
*H05K 1/02* (2006.01)
(52) U.S. Cl.
CPC ..... *H05K 1/0207* (2013.01); *H05K 2201/064* (2013.01)
(58) Field of Classification Search
CPC .... H05K 1/0207; H05K 1/0209; H05K 1/021; H05K 1/206
See application file for complete search history.

(56) References Cited

U.S. PATENT DOCUMENTS

| | | | | |
|---|---|---|---|---|
| 2005/0078457 A1* | 4/2005 | Hsieh | ................. | H05K 7/20463 361/719 |
| 2007/0079276 A1 | 4/2007 | Ashida et al. | | |
| 2016/0057854 A1 | 2/2016 | Schneider et al. | | |
| 2018/0270951 A1* | 9/2018 | Furutani | ................ | H05K 3/061 |
| 2019/0166715 A1 | 5/2019 | Luo et al. | | |
| 2019/0215948 A1 | 7/2019 | Amitz et al. | | |

FOREIGN PATENT DOCUMENTS

| | | |
|---|---|---|
| DE | 101 27 268 A1 | 4/2002 |
| DE | 10 2013 019 617 A1 | 5/2015 |
| KR | 2002-0086000 A | 11/2002 |

* cited by examiner

*Primary Examiner* — Jeremy C Norris
(74) *Attorney, Agent, or Firm* — Seed Intellectual Property Law Group LLP

(57) ABSTRACT

An arrangement for exchanging heat between two bodies comprises a circuit board, having at least one first via and at least one second via, wherein at least one heat exchange structure is integrated in the circuit board, wherein the at least one heat exchange structure comprises two heat exchange layers and an intermediate layer arranged between the two heat exchange layers, wherein the two heat exchange layers are thermally joined to each other and electrically separated from each other by the intermediate layer, wherein a first heat exchange layer is associated with the first body and can be brought into thermal contact with it and a second heat exchange layer is associated with the second body and can be brought into thermal contact with it, wherein the at least one first via and the at least one second via are each led through the two heat exchange layers and the intermediate layer arranged between the two heat exchange layers, wherein the at least one first via is in contact only with the first heat exchange layer and is insulated from the second heat exchange layer, and wherein the at least one second via is in contact only with the second heat exchange layer and is insulated from the first heat exchange layer.

8 Claims, 5 Drawing Sheets

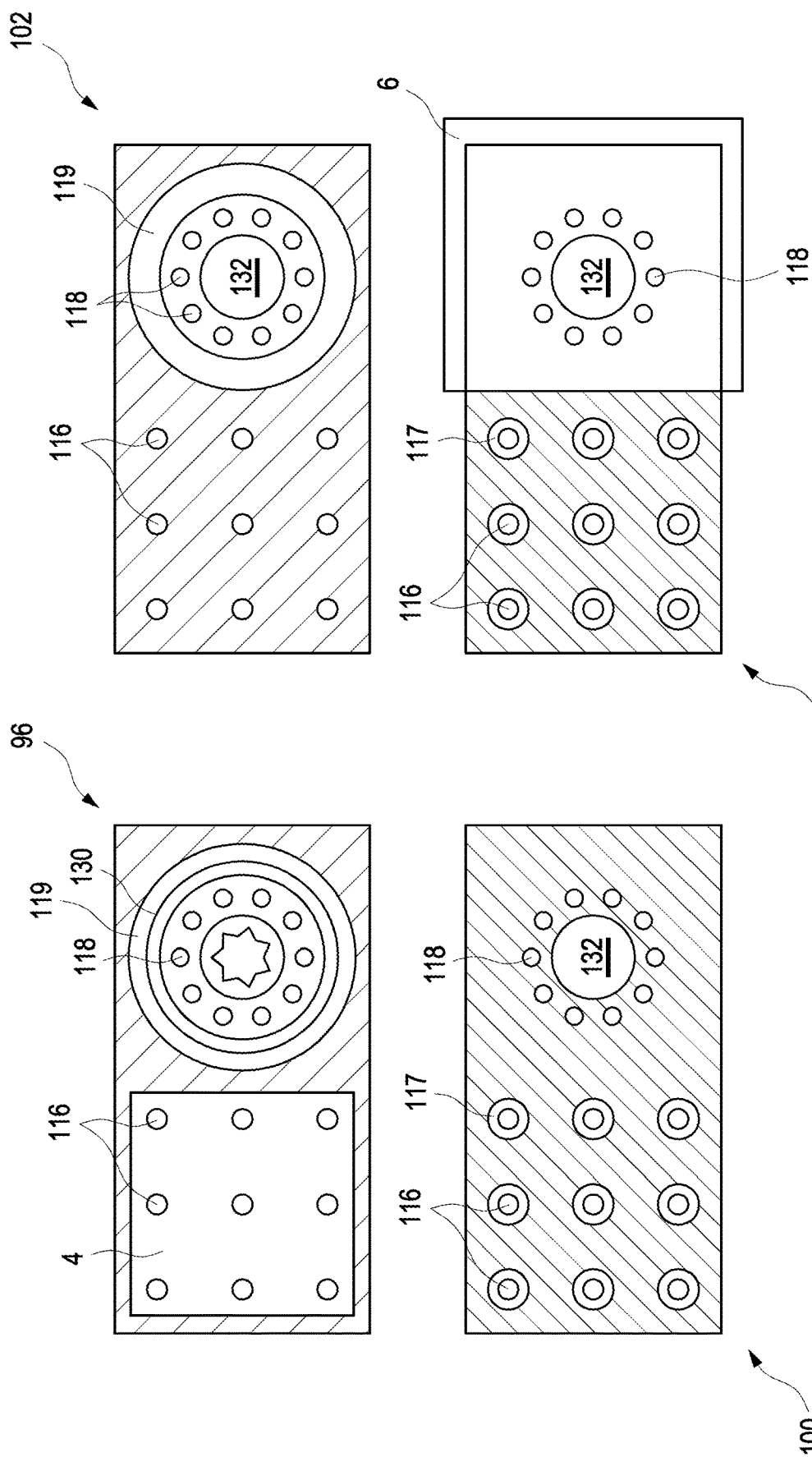

ARRANGEMENT FOR HEAT EXCHANGE

BACKGROUND

Technical Field

Embodiments of the invention specify an arrangement for exchanging heat between two bodies.

Description of the Related Art

An electrical device may comprise a circuit board which is arranged between two bodies and adapted to allow an exchange of heat between the two bodies.

Publication KR 20020086000 A shows a method of manufacturing a circuit board.

A cooling system for a data center is known from the document US 2019/0166715 A1.

In document US 2019/0215948 A1, a method is described for realizing a thermal dissipation.

Against this background, one problem was to improve a transport of heat between two bodies.

BRIEF SUMMARY

Some embodiments exchange and/or transport heat between two thermal bodies or components. This arrangement comprises a circuit board, having at least one first via and at least one second via. At least one heat exchange structure is integrated in the circuit board, which in turn comprises at least two heat exchange layers and an intermediate layer arranged between the two heat exchange layers. It is provided that the two heat exchange layers are thermally joined to each other on the one hand and electrically separated from each other on the other hand by the intermediate layer. Furthermore, a first heat exchange layer of the two heat exchange layers is associated with the first body and can be brought into thermal contact with it. A second heat exchange layer of the heat exchange structure, on the contrary, is associated with the second body and can be brought into thermal contact with it. The at least one first via is in contact only with the first heat exchange layer of a respective heat exchange structure and is insulated from the second heat exchange layer of this heat exchange structure. On the other hand, the at least one second via is in contact only with the second heat exchange layer of the heat exchange structure and is insulated from the first heat exchange layer of this heat exchange structure.

Each via is configured as a thermal through-contact and/or can be designated as such. In an embodiment, the at least one first via and the at least one second via are each led through the two heat exchange layers and the intermediate layer arranged between the two heat exchange layers.

The two heat exchange layers and the intermediate layer located between them are by definition arranged one on top of the other, and accordingly layered. It is provided that each of the two heat exchange layers is configured to transport heat in one area of the heat exchange layer of the circuit board and thus to disperse it in two dimensions.

In one embodiment, the circuit board comprises at least two heat exchange structures and at least one core, which is arranged between the at least two heat exchange structures, being formed as boards for example, or designated as such. The heat exchange layers and the at least one core are arranged one on top of the other, or layered. Each via is led through the at least one core. The vias are configured or designed to transport heat through the core, through which they are led. Hence, the vias conduct the heat through the at least one core. Furthermore, the intermediate layer is already thermally conductive, due to its thin conformation. The vias stand in thermal and electrical contact with only one of the two heat exchange layers of a heat exchange structure and transmit heat accordingly. By providing different vias, i.e., the at least one first via and the at least one second via, which differ from each other in that they are associated with either the first or the second thermal body, a transport of heat through the core is possible. Furthermore, a required electrical insulation is thus provided. The respective intermediate layer is made of the same material as the core and therefore is accordingly only slightly thermally conductive. However, it is much thinner than the core, so that it is suitable for a heat exchange between the two respective heat exchange layers of a respective heat exchange structure.

The circuit board comprises for example the following layout: a first heat exchange layer, a first intermediate layer and a second heat exchange layer, all of them forming the first heat exchange structure, the core, a third heat exchange layer, a second intermediate layer and a fourth heat exchange layer, forming the second heat exchange structure. In this case, the circuit board is configured in four layers and has four heat exchange layers. Each via or thermal through-contact is led transversely and/or perpendicularly through the circuit board.

By providing first vias and thus first thermal through-contacts as well as also second vias or second thermal through-contacts, a distinction is made between two kinds of vias, but all of them are led through the circuit board and thus through the heat exchange layers and the core, said different vias being distinguished from each other by the further components of the arrangement to which they are electrically connected and from which they are electrically separated.

It is provided that the two heat exchange layers are electrically insulated from each other by the intermediate layer situated between the heat exchange layers. Furthermore, the electrical insulation of a via within a respective heat exchange layer is achieved for example by annular clearances or corresponding insulating elements.

The proposed arrangement is designed to exchange heat between a heat source, as the first body for example, and a heat sink as the second body, where the two bodies have different temperatures.

The vias by which one of the two heat exchange layers of the respective heat exchange structure is connected to the heat source or the heat sink are designed to transport heat through further layers of the circuit board, such as the core, without thereby affecting the electrical insulation between the two heat exchange layers. It is possible for the first vias, being so-called hot vias, to be electrically connected only to the first body, such as a heat source, whereas the second vias, being so-called cold vias, are electrically connected only to the second body, such as a heat sink.

In an embodiment, the first heat exchange layer of an upper heat exchange structure makes thermal contact by a first thermal interface with the first of the two bodies and the second heat exchange layer of the upper heat exchange structure makes thermal contact by vias or thermal through-contacts and by a second thermal interface with the second of the two bodies. Furthermore, the first heat exchange layer of the lower heat exchange structure makes thermal contact by the first thermal interface and by vias or thermal through-contacts with the first of the two bodies and the second heat exchange layer of the lower heat exchanger makes thermal contact by the second thermal interface with a second one of the two bodies.

In a further embodiment, it is possible for a first or hot via to be connected electrically to the heat source across the first thermal interface, while a second cold via is electrically connected to the heat sink across the second thermal interface. In this case, it is possible for the circuit board to be connected at least in one region across the first thermal interface to the first body and at least in one region across the second thermal interface to the second body.

Usually the circuit board comprises multiple boreholes, each borehole being formed for one via, which is led through the respective borehole. Accordingly, the heat exchange layers, the intermediate layers and the core also comprise multiple parallel arranged boreholes for one respective via. The via which is led through a respective borehole of a heat exchange layer is directly connected, within this borehole of a heat exchange layer with which it makes contact, to that heat exchange layer. On the other hand, this via is separated, within the borehole of a heat exchange layer from which it is insulated, by the clearance, such as insulation, from that heat exchange layer.

Within a heat exchange structure comprising two heat exchange layers, between which the intermediate layer is situated, it is provided that each via is in thermal and electrical contact with only one of the two heat exchange layers through which it is led. On the other hand, it is thermally and electrically insulated from the other heat exchange layer of the respective heat exchange structure through which it is led. An electrical insulation is achieved in that the via has an annular clearance from the surrounding heat exchange layer, formed as a copper surface for example, and it is thus insulated or thermally and electrically separated from it.

The heat exchange layers of a respective heat exchange structure, being components of the circuit board, such as a standard circuit board, are made of copper. The vias led through the heat exchange layers, the intermediate layers and the core of the circuit board, or corresponding thermal through-contacts, are made of a thermally conductive material, such as copper, and may be filled with another thermally conductive material, such as tin, for optimization. A respective thermal interface between the circuit board and a respective body is made from any given thermal interface material. In the arrangement, it is provided that the usually necessary electrical insulation or isolation has been placed in the circuit board, such as a circuit card, so that the thermal interface material can be optimized in terms of its thermal properties. It is therefore unnecessary to employ thermal interface material which is thermally conductive, yet electrically insulated.

Furthermore, the intermediate layer of the at least one heat exchange structure is made of insulation material. The core which may be present is likewise made of insulation material. On the other hand, the vias are both thermally and electrically conductive.

The circuit board has a first, upper side and a second, lower side, with the first heat exchange structure of the circuit board ending at the upper side and the second heat exchange structure of the circuit board ending at the second side, or being bounded or closed off by the respective side. Furthermore, the circuit board is directly or indirectly connected by its upper side to the first body and by its lower side to the second body.

The circuit board in one embodiment has a first region at or on the upper side and a second region at or on the lower side, each respective region being arranged on the respective side. It is proposed that the two regions are arranged with an offset from each other. The first region on the upper side is associated with and/or facing toward the first body and is usually connected directly or indirectly to it, and the second region on the lower side is associated with and/or facing toward the second body and is usually connected directly or indirectly to it.

In one possible embodiment of the arrangement, it is possible for the circuit board, arranged between the two bodies, to have two respective regions on its two sides, a first region partially surrounding a second region. In this case, the first region on the upper side is connected to the first body and on the lower side to the second body. Vias are led only through the first region. The two bodies here are arranged parallel to each other.

Furthermore, the two bodies are situated at an offset with respect to the arrangement in one embodiment, the proposed arrangement being arranged with the circuit board between the two relatively offset bodies or being located between them.

In one embodiment, one of the two usually thermal bodies is configured as a heat source or is designated as such and the second usually thermal body is configured as a heat sink or is designated as such, the arrangement being designed during its operation to transport heat from the body designed as the heat source to the body designed as the heat sink. It is conceivable that, depending on the mode of functioning of the bodies and depending on the respective prevailing temperature, the body having a higher temperature is configured as the heat source or is designated as such and the other body, having a lower temperature, is configured as the heat sink or is designated as such. Regardless of this, the arrangement is adapted to transfer or transport heat either from the first to the second body or vice versa from the second to the first body. The heat will be transferred or transported by the arrangement through the vias perpendicularly and through the heat exchange layers in the plane of the circuit board.

In another embodiment, the arrangement comprises two electrically conductive and thus not electrically insulating thermal interfaces, the circuit board being, at least in one region, connected indirectly across the first thermal interface to the first body. Moreover, the circuit board in at least one region is connected at least indirectly across the second thermal interface to the second body. In this case, a respective thermal interface is arranged between a respective body and the side of the circuit board, such as the described region.

In another embodiment of the arrangement, at least one via which is led through the at least one intermediate layer is configured as a fastening element, such as a screw or bolt, being shaped as a rod at least for a portion. In this case, it is possible for the circuit board to be connected by the fastening element to at least one of the bodies.

Moreover, it is possible for the intermediate layer between two heat exchange layers to be made of plastic, a fiber composite, or a so-called prepreg and/or casting resin.

Of course, the above mentioned features and those yet to be explained below can be used not only in the particular indicated combination, but also in other combinations or standing alone, without leaving the scope of the present invention.

BRIEF DESCRIPTION OF THE SEVERAL
VIEWS OF THE DRAWINGS

Embodiments of the invention are presented schematically in the drawings and shall be described schematically and at length, making reference to the drawings.

FIG. 4 shows details of another embodiment of the arrangement according to the invention in a schematic representation.

The figures shall be described in connection with each other. The same components are given the same reference numbers.

DETAILED DESCRIPTION

Figure 1:
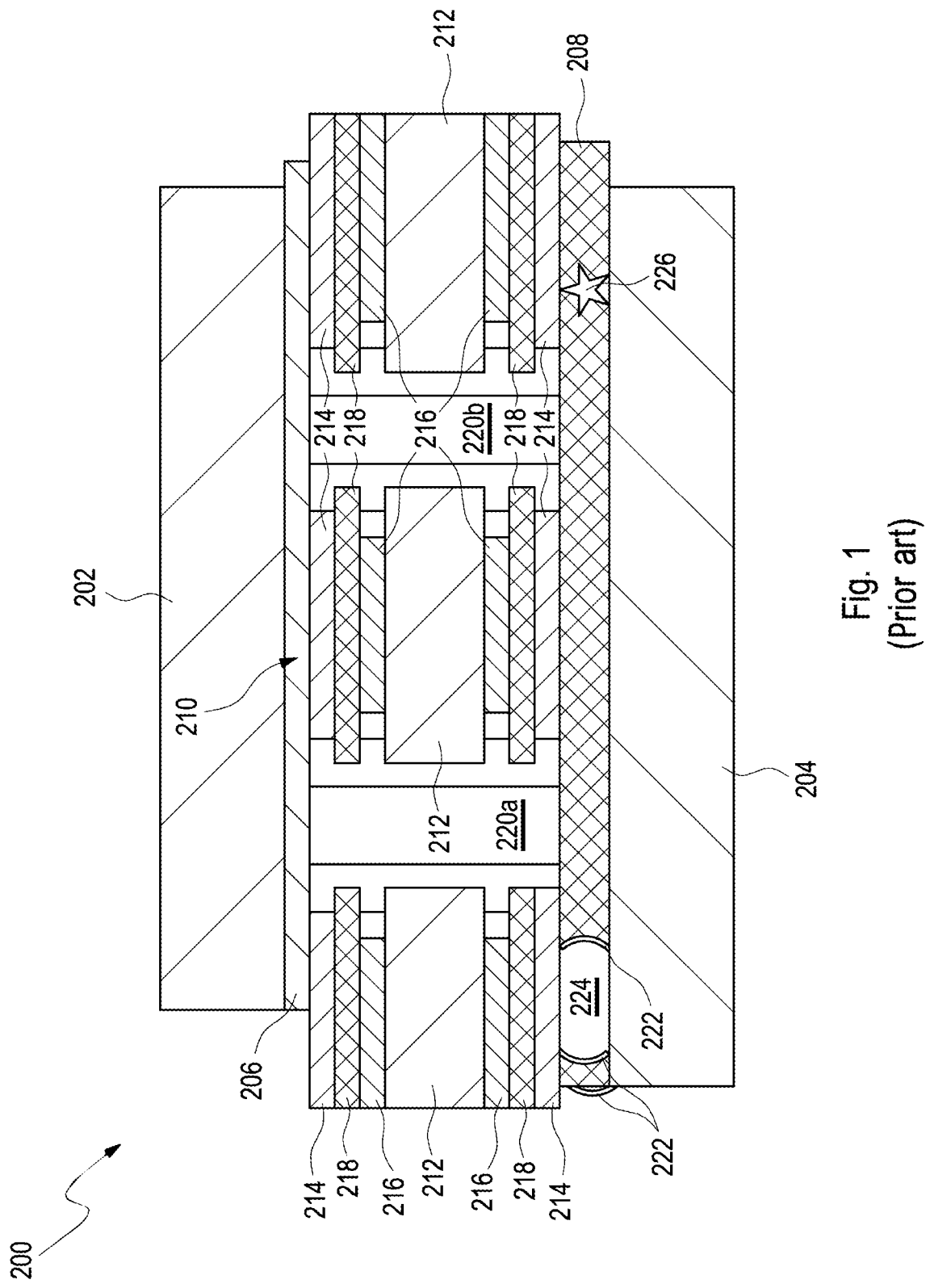
FIG. 1 shows a schematic representation of a device.

The device 200 shown schematically by FIG. 1 is known from the prior art. This device 200 comprises a heat source 202 and a heat sink 204. Between the heat source 202 and the heat sink 204 there are arranged here a first thermal interface 206, not being electrically insulating, and a second thermal interface 208, being electrically insulating. Between these two thermal interfaces 206, 208 there is arranged a circuit board 210. The circuit board 210 comprises a core 212, which is arranged between two structures, each structure comprising a first copper layer 214 and a second copper layer 216, and between said two copper layers 214, 216 there is arranged a prepreg 218.

Furthermore, vias 220a, 220b or thermal through-contacts are led through the circuit board 210. FIG. 1 further shows possible problems in the implementing of the electrical insulation of the thermal interface 208, such as creep paths at the edge, defects 222 or electrically conductive particle inclusions 226.

This device 200 has a conventional layout of vias 220a, 220b. Furthermore, it is provided that the thermal interface 208 needs to be electrically insulating at the heat sink 204. But this imposes various requirements on the minimum creep paths within this interface 208. Accordingly, no defects are allowed in the thermal interface 208. Furthermore, a sideways projection of the thermal interface 208 is required. If these two conditions are not fulfilled, the thermal interface 208 must be thick enough to achieve the minimum creep paths. But this has negative impact on the thermal conductivity of the interface 208.

If the thermal interface 208 should become contaminated with metallic particles 226 during its fabrication, there is a danger that these will push through the thermal interface 208. Therefore, high requirements are placed on the cleanliness during the fabrication. A pushing through of metallic particles 226 can usually be prevented only by a thermal interface in the form of a foil, but not with a paste, since the thermal interface 208 is not robust enough against such a pushing through when implemented as a paste. The device 200 shown here has two vias 220a, 220b between the heat source 202 and the heat sink 204. In this case, defects 224 or bubbles may furthermore occur at the edge of the thermal interface 208, but also in an area of the thermal interface 208. If metallic particles 226 push through the thermal interface 208, there is a danger of these causing a short circuit.

Figure 2A:
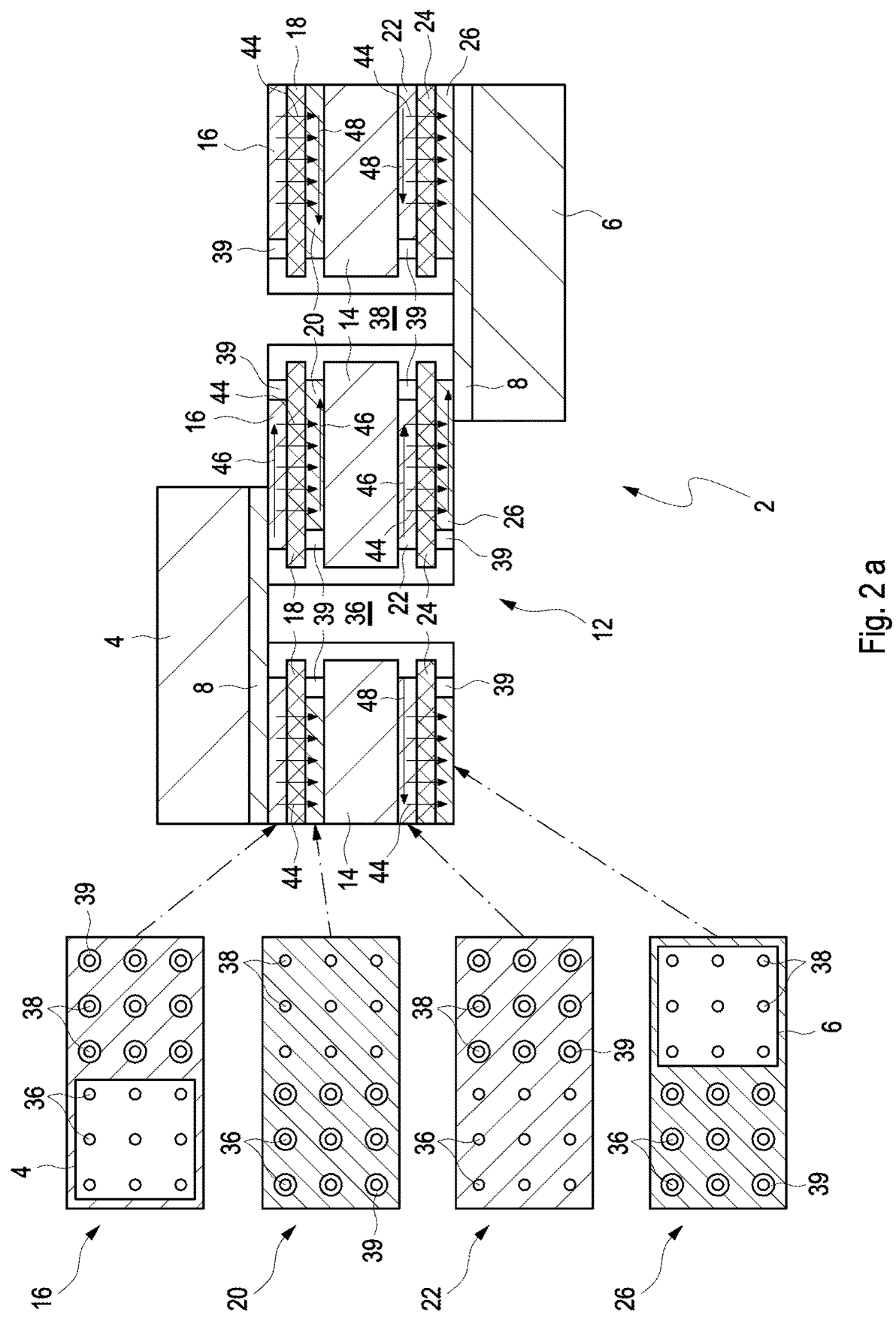
FIGS. 2a and 2b show an embodiment of an arrangement according to the invention in a schematic representation.

The first embodiment of the arrangement 2 is shown schematically in FIG. 2a from the side and in cross section. In FIG. 2b, several details of the arrangement 2 from FIG. 2a are shown further enlarged. This arrangement 2 is situated between two thermal bodies, here, a first thermal body, which is formed or designated as a heat source 4, and a second thermal body, which is formed or designated as a heat sink 6, these two bodies being arranged here with an offset from each other. Furthermore, there is arranged here at the heat source 4 a first thermal interface 8, which is electrically non-insulating and electrically conductive. At the heat sink 6 there is arranged a second thermal interface 8, which is likewise electrically non-insulating and electrically conductive.

Furthermore, the arrangement 2 comprises a circuit board 12 with a core 14, which is arranged in turn between two heat exchange structures. A first heat exchange structure of the circuit board 12 comprises a first heat exchange layer 16, an intermediate layer 18 formed as a prepreg from casting resin and/or fiber composite, and a second heat exchange layer 20, with the prepreg and the intermediate layer 18 being arranged between the two heat exchange layers 16, 20. A second heat exchange structure of the circuit board 12 comprises a third heat exchange layer 22, an intermediate layer 24 formed as a prepreg, and a fourth heat exchange layer 26. The heat exchange layers 16, 20, 22, 26 are made of copper, and the individual heat exchange layers 16, 20, 22, 26 of the circuit board 12, arranged one on top of the other, are shown here schematically next to one another. The heat exchange layers 16, 20, 22, 26 are by definition congruent with each other or arranged with a slight offset.

Furthermore, the circuit board 12 comprises, besides the core 14, the heat exchange layers 16, 20, 22, 26, and the intermediate layers 18, 24, all of them being arranged parallel to each other, for example layered, nine hot vias 36 and nine cold vias 38. The cold vias 38 here are electrically connected or bonded to the heat sink 6. The hot vias 36 are electrically connected or bonded to the heat source 4. The hot vias 36 and the cold vias 38 here are offset from each other, as are the heat source 4 and the heat sink 6.

Within the circuit board 12, the first heat exchange structure, the core 14 or a corresponding board, and the second heat exchange structure are arranged parallel to each other or layered, and furthermore they are arranged one on top of another, for example vertically. Within a respective first heat exchange structure, the first heat exchange layer 16, the intermediate layer 18 and the second heat exchange layer 20 are layered parallel to and alongside each other, being arranged here vertically on top of one another, for example. Furthermore, in a respective second heat exchange structure, the third heat exchange layer 22, the intermediate layer 24 and the fourth heat exchange layer 26 are layered parallel to each other and arranged alongside each other, for example vertically on top of one another. The vias 36, 38 or thermal through-contacts are oriented here perpendicular to the circuit board 12 and are led through holes or boreholes within the circuit board 12, i.e., through holes within the heat exchange layers 16, 20, 22, 26, within the intermediate layers 18, 24 and within the core 14.

It is apparent from the enlarged representations of the four heat exchange layers 16, 20, 22, 26 shown in FIG. 2a, and also shown enlarged FIG. 2b, that the first heat exchange layer 16 and the third heat exchange layer 22 are each connected directly to or make contact with hot vias 36, which are led through the heat exchange layers 16, 22, yet separated from cold vias 38, which are led through the heat exchange layers 16, 22, this being indicated here by annular clearances 39 around the cold vias 38. Furthermore, the second heat exchange layer 20 and the fourth heat exchange layer 26 are respectively separated from hot vias 36, which are led through these heat exchange layers 20, 26 (annular clearances 39 around the hot vias 36) and connected to cold vias 38, which are led through these heat exchange layers 20, 26. It is provided here that the hot vias 36 are in contact by the first thermal interface 8 with the heat source 4. Furthermore, the cold vias 38 are in thermal contact by the second thermal interface 8 with the heat sink 6.

Moreover, FIG. 2a shows first arrows 44, which are oriented here perpendicular to the circuit board 12 or vertically downward and indicate a heat flow through the heat exchange structures and the vias 36, 38 of the circuit board 12. Heat flows here, starting from the first heat exchange layer 16 or the third heat exchange layer 22, through a respective intermediate layer 18, 24, to a second heat exchange layer 20 or a fourth heat exchange layer 26, respectively.

Furthermore, FIG. 2a shows arrows 46, 48, which are oriented here parallel to the heat exchange layers 16, 20, 22, 26 or horizontally, the arrows 46, 48 here indicating each time a heat flow through a heat exchange layer 16, 20, 22, 26 in the direction of a cold via 38 and away from a hot via 36. These arrows 46, 48 indicate a two-dimensional dispersion of the heat within the respective heat exchange layer 16, 20, 22, 26.

In the first embodiment of the arrangement 2, the heat exchange layers 16, 20, 22, 26 arranged one on top of another are divided into two regions, which are offset from each other. It is provided here that a first region of each heat exchange layer 16, 20, 22, 26 is associated with or facing toward the heat source 4. Moreover, a second region of a respective heat exchange layer 16, 20, 22, 26, situated with an offset to the first region, is associated with or facing toward the heat sink 6. It is provided here that every first region of each heat exchange layer 16, 20, 22, 26 has the same number of hot vias 36. The positioning of the vias 36, 38 within the regions of the heat exchange layers 16, 20, 22, 26 may be chosen arbitrarily. The positioning or structure of the vias 36, 38 shown in FIGS. 2a and 2b is only one of various conceivable variants. In this regard, reference is also made to further variants, such as are shown in the further FIGS. 3 and 4. The two different vias 36, 38 here form, for example, a rectangular field, especially a square field, made up of multiple rows and columns, in this case three of them.

Figure 2:
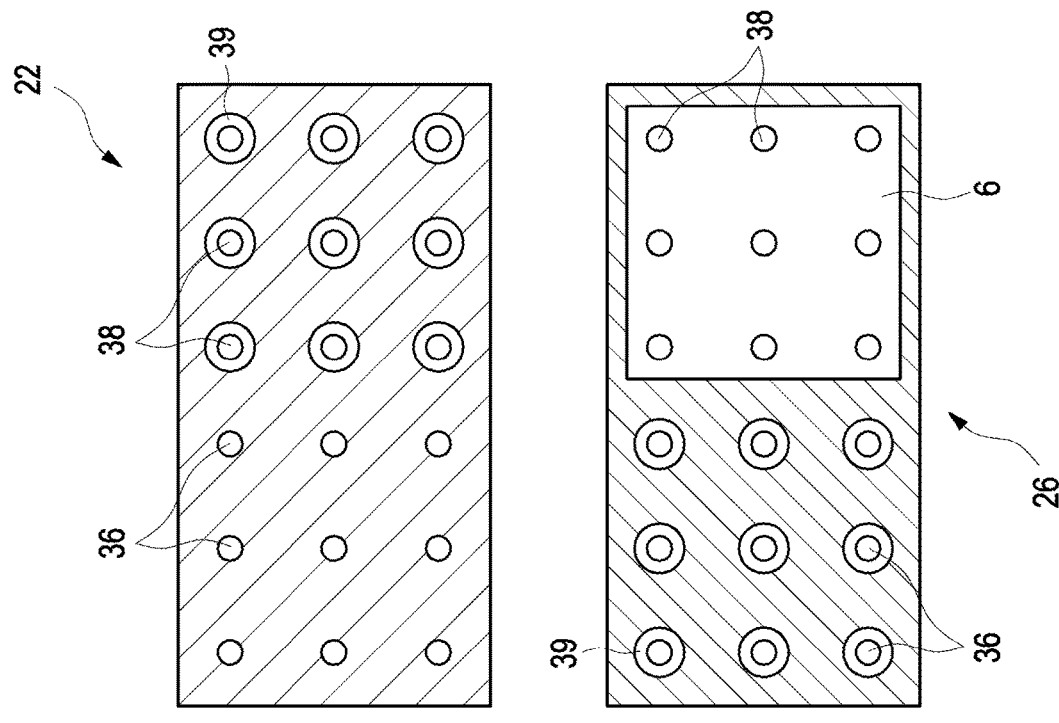
Figure 2:
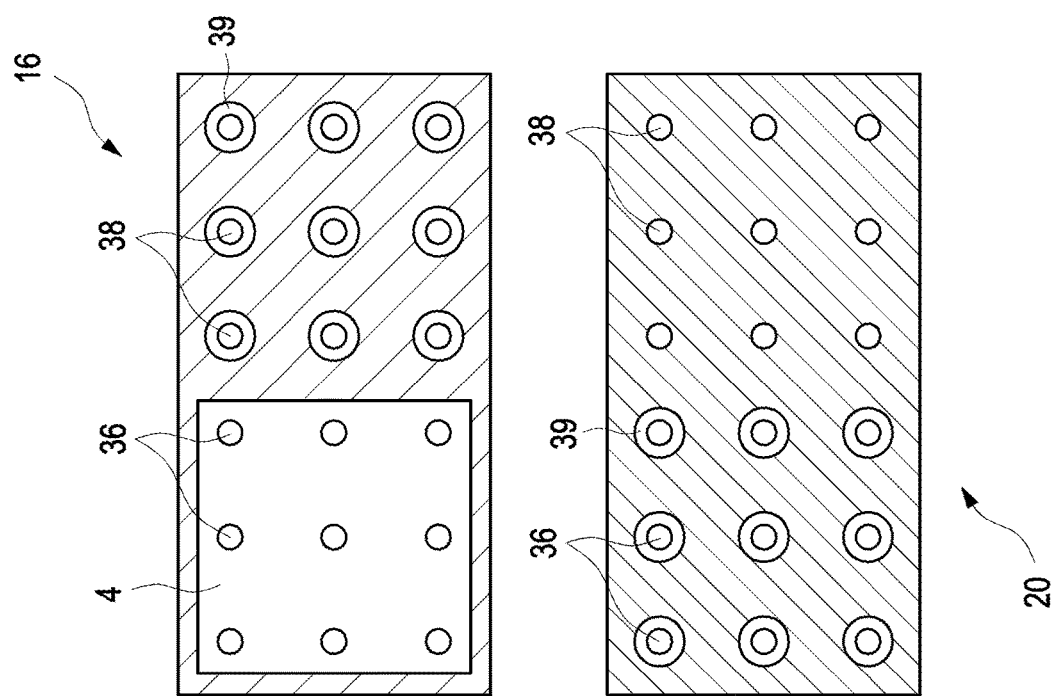
Figure 3:
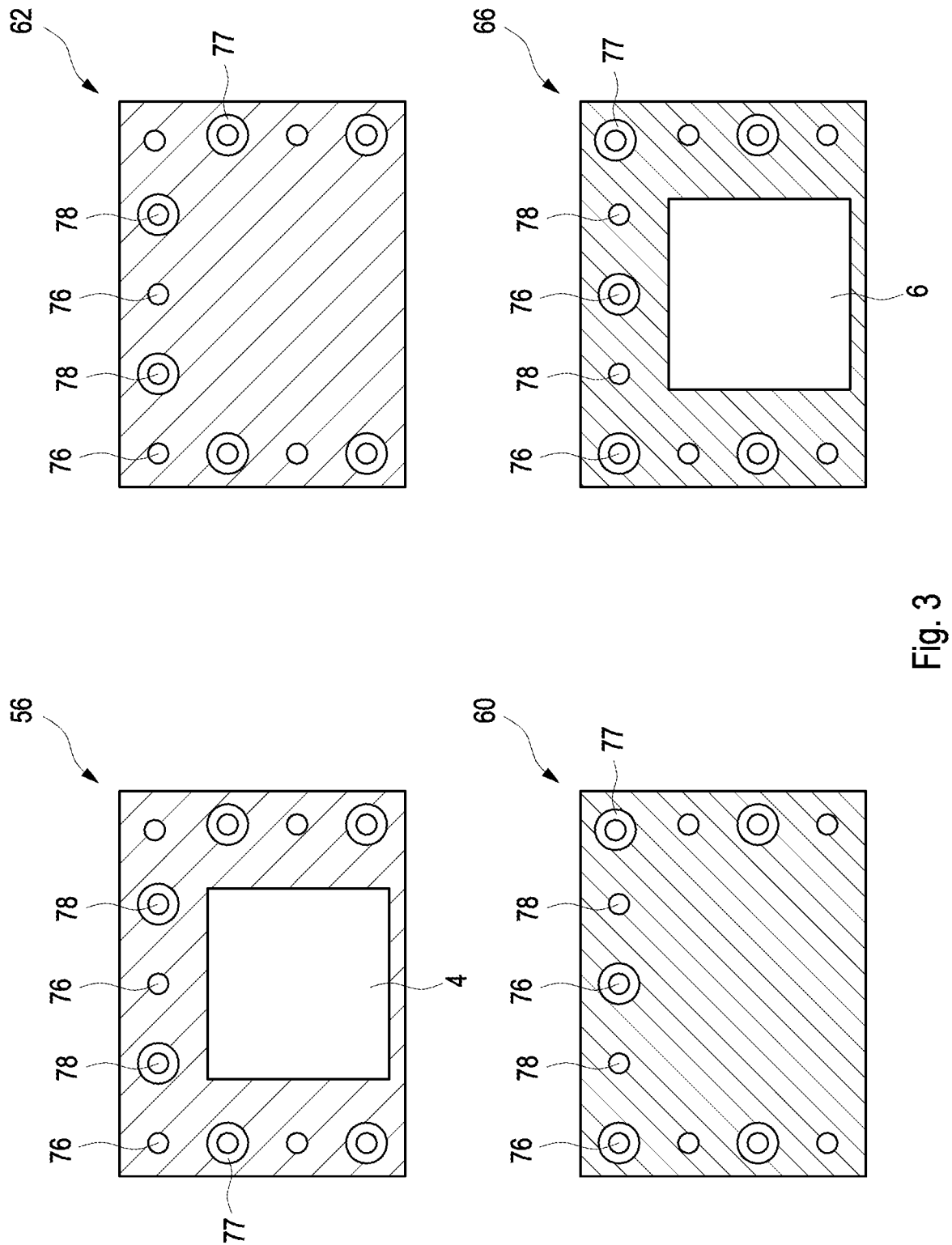
FIG. 3 shows details of another embodiment of the arrangement according to the invention in a schematic representation.

Besides the embodiment of the arrangement 2 presented in FIG. 2, two further embodiments are proposed, there being shown schematically in FIG. 3 only heat exchange layers 56, 60, 62, 66 for the second embodiment, in a top view. For the third embodiment of the arrangement, once again only heat exchange layers 96, 100, 102, 106 are shown schematically in a top view in FIG. 4.

It is proposed that the second and third embodiment of the arrangement likewise each comprise a circuit board, being configured in accordance with the circuit board 12 of the first embodiment of the arrangement 2 for transporting heat between a heat source 4 and a heat sink 6, where the heat source 4 and the heat sink 6 in the third arrangement (FIG. 4) are distant from each other, corresponding to the representation of FIG. 2a, and moreover also offset from each other, thus being correspondingly distant from each other. On the other hand, in the second arrangement (FIG. 3) the heat source 4 and the heat sink 6 are arranged directly adjacent to and on top of one another, with a circuit board arranged in between.

In order to implement the second embodiment of the arrangement according to FIG. 3, the circuit board comprises a first heat exchange layer 56, a first intermediate layer 18, a second heat exchange layer 60, a core 14, a third heat exchange layer 62, a second intermediate layer 24 and a fourth heat exchange layer 66.

In the case of the third embodiment of the arrangement according to FIG. 4, the circuit board comprises a first heat exchange layer 96, an intermediate layer 18, a second heat exchange layer 100, a core 14, a third heat exchange layer 102, an intermediate layer 24 and a fourth heat exchange layer 106.

A first variant for heat exchange layers 56, 60, 62, 66 for thermal heat exchange structures of the alternative circuit board of the second embodiment of the arrangement is shown schematically in FIG. 3. These comprise hot vias 76 and cold vias 78, which connect the first heat exchange layer 56 to the third heat exchange layer 62 and are led through the core 14, arranged in between. Moreover, the vias 76, 78 here connect the second heat exchange layer 60 to the fourth heat exchange layer 66, being led through the core 14 arranged in between.

In the second embodiment of the arrangement according to FIG. 3, it is provided that a respective heat exchange layer 56, 60, 62, 66 has a first region which is free of boreholes and which consists only of a particular heat exchange layer material, such as copper. This first region is surrounded at least partly by a second region, here a U-shaped region by definition, the second region having boreholes for vias. This means, for the second embodiment of the arrangement, that each time a first region, here a rectangular region, is enclosed on three sides by the second region. It is provided here that each time vias 76, 78 are led only through the second region, the vias 76, 78 being arranged here likewise in U-shape within the second region and enclosing the first region on three sides. The hot vias 76 are thermally connected to or make contact with only the first and third heat exchange layer 56, 62 and are thermally separated or insulated from the second and fourth heat exchange layer 60, 66 (annular clearances 77 around the hot vias 76). Furthermore, the cold vias 78 are thermally connected to or make contact with only the second and fourth heat exchange layer 60, 66 and are thermally separated or insulated from the first and third heat exchange layer 56, 62 (annular clearances 77 around the cold vias 78).

Furthermore, the first region of the first heat exchange layer 56 of the first heat exchange structure of the circuit board is associated with the heat source 4. For the fourth heat exchange layer 66 of a second heat exchange structure of the circuit board it is provided that the first region here is associated with or facing toward the heat sink 6.

The second variant for heat exchange layers 96, 100, 102, 106 for thermal heat exchange structures of the circuit board of the third embodiment of the arrangement is shown schematically in FIG. 4. These have hot vias 116 and cold vias 118, which connect the first heat exchange layer 96 to the third heat exchange layer 102 and are led through the intermediate layer 18, situated in between. Furthermore, the vias 116, 118 connect the second heat exchange layer 100 to the fourth heat exchange layer 106, being led through the intermediate layer 24 situated in between. The hot vias 116 here are thermally connected to or make contact with only the first and third heat exchange layer 96, 102 and are thermally and electrically insulated or separated from the second and fourth heat exchange layer 100, 106 (annular clearances 117 around the hot vias 116). Moreover, the cold vias 118 are thermally connected to or make contact with only the second and fourth heat exchange layer 100, 106 and are thermally and electrically insulated or separated from the first and third heat exchange layer 96, 102 (annular clearances 119 around the cold vias 118).

In the third embodiment of the arrangement, the adjacently arranged heat exchange layers 96, 100, 102, 106 are divided into two regions, which are offset from each other. It is provided here that a first region of each heat exchange layer 96, 100, 102, 106 of the first heat exchange structure of the circuit board is associated with or facing toward the heat source 4. Moreover, a second region of a respective heat exchange layer 96, 100, 102, 106, arranged at an offset from the first region, is associated with or facing toward the heat sink 6.

It is additionally provided here that each time the second region of a heat exchange layer 96, 100, 102, 106 comprises a borehole 132 for a screw as a fastening element, of which a screw head 130 is shown here. The cold vias 118 surround the borehole 132 in a circle.

As compared to the device 200 known from the prior art, it is now proposed that in all three embodiments of the arrangement 2 presented here the electrical insulation has been moved to or is arranged in the circuit board 12 (PCB). The electrical insulation is provided by the respective two heat exchange structures, between which the core 14 is arranged, within the circuit board 12. Each time, a heat exchange structure comprises two heat exchange layers 16, 20, 22, 26, 56, 60, 62, 66, 96, 100, 102, 106 with an intermediate layer 18, 24 arranged in between, through which the respective vias 36, 38, 76, 78, 116, 118 are led. Hence, it is possible to design the material of a respective thermal interface 8 for optimal thermal conductivity. This compensates for the poor thermal conductivity of the heat exchange structures which are integrated in the circuit board 12, as compared to traditional thermal vias.

It is possible for a particular embodiment of the arrangement 2 to be implemented with a standard circuit board technology. Moreover, it is possible to do away with metal insert pieces or corresponding metallic particles as well as blind vias or embedded or buried vias. It is possible to employ safe and established methods for the fabrication of circuit boards 12 to make the circuit board 12 of a particular embodiment of the arrangement, thus ensuring reliable electrical insulating properties. The intermediate layers 18, 24 or prepregs are relatively thin and have a thickness of around 100 μm, and good results can be achieved in combination with the two-dimensional nature of the heat exchange structures, despite the suboptimal thermal conduction properties of the mentioned intermediate layers 18, 24 in terms of thermal conductivity. At the same time, heat is transferred along the thermal through-contacts or vias 36, 38, 76, 78, 116, 118 which are led through the relatively thick core 14. Hot vias 36, 76, 116 and thermally and electrically connected to or make contact with only the first and third heat exchange layer 16, 22, 56, 62, 96, 102 and are thermally and electrically separated or insulated from the second and fourth heat exchange layer 20, 26, 60, 66, 100, 106 (annular clearances 39, 77, 117 or insulating elements around the hot vias 36, 76, 116). Moreover, cold vias 38, 78, 118 are thermally and electrically connected to or make contact with only the second and fourth heat exchange layer 20, 26, 60, 66, 100, 106 and are thermally and electrically separated or insulated from the first and third heat exchange layer 16, 22, 56, 62, 96, 102 (annular clearances 39, 77, 119 or insulating elements around the cold vias 38, 78, 118).

In one embodiment, as compared to the prior art, it is possible to multiply active areas in the heat exchange structures proposed here when the circuit boards 12 have multiple layers by enlarging and/or increasing the number of respective heat exchange structures. If the circuit board 12, as shown here, comprises two heat exchange structures with a total of four heat exchange layers 16, 20, 22, 26, 56, 60, 62, 66, 96, 100, 102, 106, it is possible to double the active area. It is possible for the active area of a heat exchanger which is integrated in the circuit board 12 to be larger than a contact area of the heat sink 6. A heat dissipation through the comparatively thick core 14 of the particular circuit board 12 is provided here by the vias 36, 38, 76, 78, 116, 118, which are led through the circuit board 12. Moreover, within each heat exchange layer 16, 20, 22, 26, 56, 60, 62, 66, 96, 100, 102, 106 the heat is dispersed or spread out in two dimensions, and then transferred in two dimensions to a respective neighboring layer.

As was shown for the heat exchange layers 96, 100, 102, 106 of the third embodiment of the arrangement (FIG. 4), it is also possible to incorporate existing screw fastening points of the circuit board in a heat removal concept, wherein one bearing surface of a particular outermost heat exchange layer 96, 106 at the screw fastening point is utilized at the same time for the heat transfer. It is possible to design the mechanical connection of the respective outermost heat exchange layer 96, 106 or board to be not electrically insulated, which significantly simplifies the design.

In all three embodiments presented for the arrangement 2 it is possible to resolve a conflict between the electrical insulation and the thermal conductivity. It is proposed here that the electrical insulation is provided in or within the circuit board 12. The thermal interfaces 8 are provided and designed each time only for a thermal coupling between the heat source 4 or a corresponding heating body and the particular arrangement, and the heat sink 6 or a corresponding cooling body.

German patent application no. 10 2020 128729.1, filed Nov. 2, 2020, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An arrangement for exchanging heat between first and second bodies, comprising:
   a circuit board including at least one first via and at least one second via;
   wherein at least one heat exchange structure is integrated in the circuit board;
   wherein the at least one heat exchange structure comprises first and second heat exchange layers and an intermediate layer arranged between the first and second heat exchange layers;
   wherein the first and second heat exchange layers are thermally joined to each other and electrically separated from each other by the intermediate layer;
   wherein the first heat exchange layer is associated with the first body and can be brought into thermal contact with the first body and the second heat exchange layer is associated with the second body and can be brought into thermal contact with the second body;
   wherein the at least one first via and the at least one second via are each led through the first and second heat exchange layers and the intermediate layer arranged between the first and second heat exchange layers;
   wherein the at least one first via is in contact only with the first heat exchange layer and is insulated from the second heat exchange layer; and wherein the at least one second via is in contact only with the second heat exchange layer and is insulated from the first heat exchange layer.

2. The arrangement according to claim 1, in which the first and second heat exchange layers and the intermediate layer are arranged one on top of the other, wherein each of the first and second heat exchange layers are configured to transport heat in one area of the heat exchange layer of the circuit board.

3. The arrangement according to claim 1, in which the circuit board comprises at least two heat exchange structures and at least one core, which is arranged between the two heat exchange structures, wherein the heat exchange layers and the at least one core are arranged one on top of the other, wherein the vias are led through the at least one core, make contact with the at least one core, and are configured to transport heat through the at least one core.

4. The arrangement according to claim 1, which is designed to exchange heat between the first body, configured as a heat source, and the second body, configured as a heat sink.

5. The arrangement according to claim 4, in which a respective first heat exchange layer of the heat source is associated with a respective second heat exchange layer of the heat sink.

6. The arrangement according to claim 1, wherein the circuit board is connected by a first electrically conductive thermal interface to the first body and by a second electrically conductive thermal interface to the second body.

7. The arrangement according to claim 1, in which each heat exchange layer and the vias are formed from electrically conductive material, while each intermediate layer is formed from insulation material.

8. The arrangement according to claim 1, in which each heat exchange layer and each intermediate layer comprises multiple boreholes, and a via is led through each borehole, while each respective via within each respective borehole of a heat exchange layer with which it is in contact is connected directly to that heat exchange layer, and each respective via within each respective borehole of a heat exchange layer from which it is insulated is separated by a clearance from the heat exchange layer.

* * * * *